United States Patent [19]
Rahman et al.

[11] Patent Number: 5,962,183
[45] Date of Patent: Oct. 5, 1999

[54] METAL ION REDUCTION IN PHOTORESIST COMPOSITIONS BY CHELATING ION EXCHANGE RESIN

[75] Inventors: M. Dalil Rahman, Flemington, N.J.; Daniel P. Aubin, Voluntown, Conn.

[73] Assignee: Clariant Finance (BVI) Limited, Virgin Islands (Br.)

[21] Appl. No.: 08/562,867

[22] Filed: Nov. 27, 1995

[51] Int. Cl.$^6$ .............................. G03F 7/004; C02F 1/42
[52] U.S. Cl. ...................... 430/270.1; 430/168; 528/482; 210/660; 210/681; 210/682
[58] Field of Search .................................. 430/168, 169, 430/270.1; 528/482; 210/660, 681, 682

[56] References Cited

U.S. PATENT DOCUMENTS

| | | | |
|---|---|---|---|
| 2,929,808 | 3/1960 | Ross et al. | 260/94.9 |
| 4,033,909 | 7/1977 | Papa | 260/482 |
| 4,033,910 | 7/1977 | Papa | 260/25 F |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,721,665 | 1/1988 | Dooley et al. | 430/270 X |
| 4,747,954 | 5/1988 | Vaughn et al. | |
| 4,784,937 | 11/1988 | Tanaka et al. | 430/331 |
| 4,833,067 | 5/1989 | Tanaka etal. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,212,044 | 5/1993 | Liang et al. | 430/270 X |
| 5,284,930 | 2/1994 | Matsumoto et al. | 528/482 |
| 5,286,606 | 2/1994 | Rahman et al. | 430/311 |
| 5,300,628 | 4/1994 | Honda | 528/482 |
| 5,350,714 | 9/1994 | Trefonas, III et al. | 430/5 |
| 5,378,802 | 1/1995 | Honda | 210/660 X |
| 5,446,125 | 8/1995 | Honda et al. | 430/192 |
| 5,472,616 | 12/1995 | Szmanda et al. | 210/683 |
| 5,476,750 | 12/1995 | Rahman et al. | 430/168 |
| 5,500,127 | 3/1996 | Carey et al. | 210/685 |
| 5,521,052 | 5/1996 | Rahman et al. | 430/270.1 |
| 5,525,315 | 6/1996 | Burke | 423/24 |

FOREIGN PATENT DOCUMENTS

| | | |
|---|---|---|
| 544234 | 6/1993 | European Pat. Off. . |
| 544325 | 6/1993 | European Pat. Off. . |
| A-0588492 | 3/1994 | European Pat. Off. . |
| 1072155 | 3/1989 | Japan . |
| 1-228560 | 9/1989 | Japan . |
| 4-65415 | 3/1992 | Japan . |
| 1509354 | 5/1978 | United Kingdom . |
| WO 90/01726 | 2/1990 | WIPO . |
| WO 93/12152 | 6/1993 | WIPO . |
| WO 93/18437 | 9/1993 | WIPO . |
| WO 94/01807 | 1/1994 | WIPO . |
| WO 94/12912 | 6/1994 | WIPO . |
| WO 94/14858 | 7/1994 | WIPO . |
| WO 94/14863 | 7/1994 | WIPO . |
| WO 96/12214 | 4/1996 | WIPO . |
| WO 96/20965 | 7/1996 | WIPO . |
| WO 96/21175 | 7/1996 | WIPO . |
| WO 96/21176 | 7/1996 | WIPO . |
| WO 97/11929 | 4/1997 | WIPO . |
| WO 97/12280 | 4/1997 | WIPO . |
| WO 97/12281 | 4/1997 | WIPO . |

OTHER PUBLICATIONS

Bayard; "Water Free of Heavy Metals for Medical Use and Ion Exchange REsin Used in its Preparation" Nov. 16,1992; CA98(26):221589z.

Hirai et al; "Treatment of Waste Waters Containing Formakdehyde and Metals with Chelating Ion Exchange Resins"; Nov. 5, 1975; CA84(14):95328j.

Kimura et al; "Purification of Formaldehyde"; Mar. 9, 1977; CA87(7:52776y.

T. Tanada; "A New Photolithography Tech. with Antireflective . . . "; Journal of the Electrochemical Society, vol. 137, No. 12, pp. 393900–3905; Dec. 1990, Manchester, New Hampshire.

Rohm and HAAS Company; "Amberlite Ion Exchange Resins Laboratory Guide"; Sep. 1979; Philadelphia, PA.

JP–A–1190713 Inatomi, Shegeki et al, Jul. 31, 1989; Chemical Abstracts, vol. 112, No. 18, Apr. 30, 1990, Columbus, OH, p. 17, the Abstract 15920lu.

G. Noti et al, "Deoinozed Water Plants for Semiconductor Device Fabrication", Proceedings of the Inst:Radio and Electron. Eng, Aust.(Australia), vol. 34, No. 2, Mar. 1973, pp. 45–51.

Derwent Publications Ltd., London, GB; JP–A–05 234 876 (OCG Microelectronic Materials), Sep. 10, 1993.

*Primary Examiner*—John S. Chu
*Attorney, Agent, or Firm*—Andrew F. Sayko Jr.

[57] ABSTRACT

The present invention provides methods for producing a photoresist having a very low level of metal ions, utilizing a treated chelating ion exchange resins to make the neutral ammonium salt or acid form. A method is also provided for producing semiconductor devices using such photoresist compositions.

9 Claims, No Drawings

METAL ION REDUCTION IN PHOTORESIST COMPOSITIONS BY CHELATING ION EXCHANGE RESIN

BACKGROUND OF THE INVENTION

The present invention relates to a process for producing photoresist having a very low level of metal ions, especially sodium and iron. Further, the present invention relates to a process for coating substrates with these light-sensitive compositions as well as the process of coating, imaging and developing these light-sensitive mixtures on substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCl gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels of less than 1.0 ppm in the photoresist have been found to adversely affect the properties of such semiconductor devices.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited. On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing photoresist containing a very low level of metal ions, especially sodium and iron, and to a process for using such photoresists in producing semiconductor devices.

The photoresist obtained has a very low levels of metal ions such as iron, sodium, potassium, calcium, magnesium, copper and zinc. The metal ion level is preferably less than 50 ppb each. Sodium and iron are the most common metal ion contaminants and among the easiest to detect. The level of these metal ions serves as an indicator of the level of other metal ions. The level of sodium and iron ions are less than 50 ppb each, preferably less than 40 ppb, more preferably less than 20 ppb, and most preferably less than 10 ppb each.

Photoresists having a very low level of metal ions may be obtained by utilizing a chelating ion exchange resin to purify such photoresist compositions. The claimed invention comprises heating a photoresist compositions with a neutral ammonium salt or acid form of a chelating ion exchange resin, which is cleaned by: a) washing with water and then a mineral acid solution, b) washing with DI water, and/or c) washing with an ammonium hydroxide solution (4–10%) in DI water, d) washing with DI water, and e) washing with a solvent which is compatible with the photoresist solvent.

The present invention provides a process for producing a photoresist having a very low level of metal ions, particularly sodium and iron. In one embodiment, the process utilizes an ammonium salt of a chelating ion exchange resin, to purify the photoresist compositions. The process also utilizes an acid form of a chelating ion exchange to purify the photoresist compositions. The subject process for purifying a photoresist composition comprises:

a)
1) washing a chelating ion exchange resin, e.g. in a column or in a batch process, with deionized (DI) water, followed by washing with a mineral acid solution (e.g. a 5–98% solution of sulfuric, nitric or hydrochloric acid), washing again with DI water, and thereby reducing the level of sodium and iron ions in the ion exchange resin to less than 100 ppb each, preferably less than 50 ppb each and most preferably no more than 20 ppb each; or
2) washing a chelating ion exchange resin, e.g. in a column or in a batch process, with DI water, followed by washing with a mineral acid solution (e.g. a 5–98% solution of sulfuric, nitric or hydrochloric acid), washing again with DI water, followed by washing with an ammonium hydroxide solution (2–28%) and thereby converting the ion exchange resin to an ammonium salt, followed by washing again with DI water, and thereby reducing the level of sodium and iron ions in the ion exchange resin to less than 100 ppb each, preferably less than 50 ppb and most preferably no more than 20 ppb;

b) removing water from the ion exchange resin of 1) or 2), such as by washing with electronic grade acetone, followed by washing with a photoresist solvent, which is compatible with the solvent in the photoresist composition to be purified, such as propylene glycol methyl ether acetate (PGMEA) and thereby removing all other solvents, such as acetone;

c) mixing a photoresist composition with the ammonium salt of the chelated ion exchange resin or the acid form of the chelated ion exchange resin, and heating the mixture in the range of 30 to 90° C., preferably 35 to 70° C., more preferably 40 to 65° C., most preferably 45 to 60° C.; for 1 to 80 hours, preferably 3 to 50 hours, more preferably 4 to 25 hours, even more preferably 5 to 15 hours, most preferably 6 to 12 hours; followed by filtering through a 0.05 to 0.5 $\mu$m (micrometer) filter, preferably a filter having a micron rating of less than or equal to 0.1 $\mu$m (micrometer) and thereby reducing the level of sodium and iron ions in the photoresist, composition to less than 100 ppb each, preferably less than 50 ppb each, more preferably less than 20 ppb each, even more preferably less than 10 ppb, and most preferably less than 5 ppb each.

The invention further provides a method for producing a semiconductor device by producing a photo-image on a substrate by coating a suitable substrate with a positive working photoresist composition by:

a)
1) washing a chelating ion exchange resin, e.g. in a column or in a batch process, with deionized (DI) water, followed by washing with a mineral acid solution (e.g. a 5–98% solution of sulfuric, nitric or hydrochloric acid), washing again with DI water, and thereby reducing the level of sodium and iron ions in the ion exchange resin to less than 100 ppb each, preferably less than 50 ppb each and most preferably no more than 20 ppb each; or
2) washing a chelating ion exchange resin, e.g. in a column or in a batch process, with DI water, followed by washing with a mineral acid solution (e.g. a 5–98% solution of sulfuric, nitric or hydrochloric acid), washing again with DI water, followed by washing with an ammonium hydroxide solution (2–28%) and thereby converting the ion exchange resin to an ammonium salt, followed by washing again with DI water, and thereby reducing the level of sodium and iron ions in the ion exchange resin to less than 100 ppb each, preferably less than 50 ppb and most preferably no more than 20 ppb;

b) removing water from the ion exchange resin of 1) or 2), such as by washing with electronic grade acetone, followed by washing with a photoresist solvent, which is compatible with the solvent in the photoresist composition to be purified, such as propylene glycol methyl ether acetate (PGMEA) and thereby removing all other solvents, such as acetone;

c) mixing a photoresist composition with the ammonium salt of the chelated ion exchange resin or the acid form of the chelated ion exchange resin, and heating the mixture in the range of 30 to 90° C., preferably 35 to 70° C., more preferably 40 to 65° C., most preferably 45 to 60° C.; for 1 to 80 hours, preferably 3 to 50 hours, more preferably 4 to 25 hours, even more preferably 5 to 15 hours, most preferably 6 to 12 hours; followed by filtering through a 0.05 to 0.5 $\mu$m (micrometer) filter, preferably a filter having a micron rating of less than or equal to 0.1 $\mu$m (micrometer) and thereby reducing the level of sodium and iron ions in the photoresist composition to less than 100 ppb each, preferably less than 50 ppb each, more preferably less than 20 ppb each, even more preferably less than 10 ppb, and most preferably less than 5 ppb each;

d) coating a substrate with the photoresist composition and heat treating the coated substrate until substantially all of the solvent is removed; image-wise exposing the photoresist composition and removing the image-wise exposed areas of such composition with a suitable developer, such as an aqueous alkaline developer. Optionally one may perform a baking of the substrate either immediately before or after the removing step.

It has been found that a photoresist having very low level of metal ions contamination cannot be obtained from a photoresist composition which is already contaminated by high level of metal ions by attempting to remove the metal ions from the photoresist with an ion exchange resin unless: 1) the chelating ion exchange resin is washed with DI water and a mineral acid solution, or an ammonium hydroxide solution and DI water, as described above; 2) the ammonium salt form or the acid form of chelating ion exchange resin is then thoroughly rinsed with a solvent which is compatible with the photoresist compostion solvent; 3) the photoresist composition is then mixed and heated with the acid form and/or ammonium form of the chelating ion exchange resin at an elevated temperature for at least one hour.

DETAILED DESCRIPTION OF THE PREFERRED EMBODIMENTS

A chelating ion exchange resin, such as a styrene/divinylbenzene chelating ion exchange resin, is utilized in the present process. A chelating ion exchange is one that has paired iminodiacetate functional groups or iminodiacetic acid functional groups. Such ion exchange resins are available from Rohm and Haas Company, e.g. AMBERLITE® IRC 718 (sodium form), or Chelex® 20 or Chelex® 100 available as the sodium form from Bio Rad Co. These resins typically contain as much as 100,000 to 500,000 ppb each of sodium and iron.

The photoresist composition is preferably mixed with the acid form of the chelating ion exchange resin, heated for at least one hour at a temperature of 30 to 90° C. Such a photoresist composition, prior to treatment according to the present invention, typically contains from 60 to 1000 ppb each of sodium and iron ions. During the process of the present invention, these levels are each reduced to as low as 5 ppb each.

Suitable solvents for such photoresist compositions, and for novolak resins, may include propylene glycol monoalkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate and 2-heptanone. The preferred solvents are propylene glycol methyl ether acetate (PGMEA) ethyl-3-ethoxypropionate (EEP) and ethyl lactate (EL).

Other optional ingredients such as colorants, dyes, anti-striation agents, leveling agents, plasticizers, adhesion promoters, speed enhancers, solvents and surfactants such as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxycyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy)ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C., for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas, normally by immersion in an alkaline developing solution or by a spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide (TMAH). After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

200 grams of Amberlite® IRC 718 chelating ion exchange resin beads were placed in a conical flask and deionized water was added, so that all of the resin beads were under water. The flask was sealed and allowed to stand for half an hour to swell the resin beads. The water was then decanted, additional deionized water was then added to cover the resin beads, and the flask was shaken slowly. The water was again decanted. The rinsing with deionized water and decanting steps were repeated three more times. The resulting slurry of ion exchange resin was poured into a glass column having a diameter equipped with a porous disk and a stopcock. The resin was allowed to settle to the bottom and the column was back flushed with deionized water for 25 minutes. The resin was again allowed to settle to the bottom.

The bed length was measured and the bed volume was calculated as 320 ml. A 10 percent sulfuric acid solution was passed through the resin bed at a rate of about 32 ml./min. 6 bed volumes of the acid solution were passed through the resin bed. Sufficient amount of deionized water was then passed through the resin bed at about the same flow rate, to remove the acid. The pH of the effluent water was measured to assure that it matched the pH of 6 for fresh deionized water. An ammonium hydroxide solution (6%, 6 bed volumes) was then passed through the column at the same rate, followed by DI water (about 60 bed volumes) to remove the ammonium hydroxide. The pH of the effluent water was measured to assure that it matched the pH of 6 for fresh deionized water. 2 bed volumes of electronic grade acetone was passed through the resin bed to remove water, followed by 2 bed volumes of PGMEA to remove the acetone.

242 grams of photoresist containing about 135 ppb of sodium and about 123 ppb of iron was mixed with 24 gram of this chelating ion exchange resin and heated at 70° C. for 6 hours and then filtered through a 0.2 $\mu$m (micrometer) filter. The photoresist obtained had a low level of metal ions as follows: sodium-8 ppb, iron-87 ppb.

EXAMPLE 2

200 grams of Amberlite® IRC 718 chelating ion exchange resin beads were placed in a conical flask and deionized water was added so that all of the resin beads were under water. The flask was sealed and allowed to stand for half an hour to swell the resin beads. The water was decanted, deionized water was added to cover the resin beads and the flask was shaken slowly. The water was again decanted. The rinsing with deionized water and decanting steps were repeated three more times. The resulting slurry of chelating ion exchange resin was poured into a glass column having a porous disk and a stopcock. The resin was allowed to settle to the bottom and the column was back flushed with deionized water for 25 minutes. The resin was again allowed to settle to the bottom.

The bed length was measured and the bed volume was calculated as 320 ml. A 10 percent sulfuric acid solution was passed down through the resin bed at a rate of about 32 ml./min. 6 bed volumes of the acid solution were passed down through the resin bed. A sufficient amount of of deionized water was then passed down through the resin bed at about the same flow rate to remove the acid. The pH of the effluent water was measured to assure that it matched the pH of 6 for fresh deionized water. 2 bed volumes of electronic grade acetone was passed down through the resin bed to remove water, followed by 2 bed volumes of PGMEA to remove acetone. The chelated ion exchange resin/PGMEA slurry was transfered to a metal ion free bottle.

200 grams of photoresist containing about 180 ppb of sodium and less than 236 ppb of iron was placed in a metal ion free flask equipped with a stirrer and a thermometer, and 20 grams of chelating ion exchange resin (acid form) was added. It was heated for 7 hours at 55° C. with stirring. The mixture was cooled to 40° C. and filtered through a 0.2 $\mu$m (micrometer) filter. The photoresist obtained had a low level of metal ions as follows: sodium 16 ppb and iron 43 ppb.

EXAMPLE 3

Example 2 was repeated and 242 grams of photoresist containing about 180 ppb of sodium and about 236 ppb of iron was treated. The photoresist obtained had a low level of metal ions as follows: sodium-37 ppb, iron 45-ppb.

Comparative Example 4

200 grams of Amberlite® IRC 718 chelating ion exchange resin beads were placed in a conical flask and deionized water was added so that all of the resin beads were under water. The flask was sealed and allowed to stand for half an hour to swell the resin beads. The water was decanted, deionized water added to cover the resin beads and the flask was shaken slowly. The water was again decanted. The rinsing with deionized water and decanting steps were repeated three more times. A 10 percent sulfuric acid solution (300 g) was added and stirred for 30 minutes by magnetic stirrer and the mixture was allowed to settle. The acid solution was decanted. The rinsing with water and then acid process was repeated 3 more times. 300 g of DI water was added and stirred for 30 minutes and then allowed to settle. The water was decanted. The rinsing with water process was repeated 3 more times. The rinsing process was repeated with electronic grade acetone to remove water, followed by PGMEA to remove acetone. The chelating ion exchange resin (acid form) and PGMEA slurry was transfered to a metal ion free bottle.

200 grams of photoresist containing about 156 ppb of sodium and 220 ppb of iron was placed in a metal ion free flask equiped with a stirrer and a thermometer, and 20 grams of chelating ion exchange resin (acid form) was added. It was stirred for 7 hours at room temperature. The mixture was filtered through a 0.2 μm (micrometer) filter. The photoresist obtained had a low level of Na: 5 ppb, but a high level of Fe: 172 ppb.

EXAMPLE 5

The photoresist composition from example 2 was coated onto a hexamethyl disilazane (HMDS) primed silicon wafer to a 1.29 μm (micrometer) thickness, using a soft bake at 110° C. for 60 seconds on an SVG®8100 I-line hot plate. The reference (untreated) was also coated to 1.29 μm thickness by the same procedure. The exposure matrix was printed on the coated wafers using a 0.54 NA NIKON® i-line stepper and a NIKON® resolution reticle. The exposed wafers were post exposure baked (PEB) at 110° C. for 60 seconds on the I-line hot plate. The wafers were then puddle developed using AZ® 300 MIF developer (2.38% TMAH). The developed wafers were examined using a HITACHI® S-400 scanning electron microscope (SEM). A nominal dose (Dose to Print: DTP) was measured at the best focus. The photospeed, resolution and depth of focus were measured and are shown below:

|  | Reference | Treated sample |
| --- | --- | --- |
| Photospeed | 165 mJ/cm$^2$ | 175 mJ/cm$^2$ |
| Resolution | 0.4 mm | 0.35 mm |
| Depth of focus | +0.2/−0.4 | 0.0/0.4 |

We claim:
1. A method for producing a photoresist composition having a very low level of metal ions
   a)
   1) washing a chelating ion exchange resin process with deionized water followed by washing with a mineral acid solution, washing again with deionized water, and thereby reducing the level of sodium and iron ions in the ion exchange resin to less than 100 ppb; or
   2) washing a chelating ion exchange exchange resin with deionized water, followed by washing with a mineral acid solution, washing again with deionized water, followed by washing with an ammonium hydroxide solution and thereby converting the chelating ion exchange resin to an ammonium salt, followed by washing with deionized water, and thereby reducing the level of sodium and iron ions in the ion exchange resin to less than 100 ppb each;
   b) removing water from the ion exchange resin of 1) or 2), followed by washing with a photoresist solvent which is compatible with the solvent in the photoresist composition to be purified;
   c) mixing a photoresist composition with the ammonium salt of the chelating ion exchange resin or the acid form of the chelated ion exchange resin and heating in the range of 30 to 90° C.; for 1 to 80 hours, followed by filtering through a 0.05 to 0.5 μm (micrometer) filter; and thereby reducing the level of sodium and iron ions in the photoresist compisition to less than 100 ppb each.

2. The method of claim 1 wherein said ion exchange resin is washed to reduce the sodium and iron ion level to less than 50 ppb each.

3. The method of claim 1 wherein said ion exchange resin of step c) is heated in the range of from 35° C. to 70° C.

4. The method of claim 1 further comprising the step of baking the coated substrate immeidately before or after the removing step.

5. The method of claim 1 wherein the sodium and iron ion level of the photoresist is reduced to less than 50 ppb each.

6. The method of claim 1 wherein said ion exchange resin is washed to reduce the total sodium and iron ion level to less than 20 ppb each.

7. The method of claim 1 wherein said photoresist produced has a sodium and iron ion level of less than 50 ppb each.

8. The method of claim 1 wherein the photoresist solvent and the solvent used for washing said ion exchange resin are identical.

9. The method of claim 8 wherein said solvent is selected from the group consisting of propylene glycol methyl ether acetate, ethyl-3-ethoxypropionate and ethyl lactate.

\* \* \* \* \*